United States Patent Office 3,726,679

Patented Apr. 10, 1973

3,726,679

LIGHT SENSITIVE EPOXY FORMULATION

Oscar R. Abolafia and Michael J. Canestaro, Endicott, N.Y., assignors to International Business Machines Corporation, Armonk, N.Y.

No Drawing. Filed June 30, 1971, Ser. No. 158,541
Int. Cl. G03c 5/24
U.S. Cl. 96—48 HD 16 Claims

ABSTRACT OF THE DISCLOSURE

A method of rendering epoxy formulations light sensitive is provided. A formulation comprising an epoxy and a hardener is allowed to slowly react, or age, until the material is near its gel point, e.g., for about 1 day to about 30 days. After aging, from about 1% to about 5% of a sensitizer selected from a halogenated organic compound is added. The formulation is coated on a substrate, exposed to actinic radiation and solvent developed.

BACKGROUND OF THE INVENTION

This invention relates to epoxy formulations and to a method of rendering them light sensitive. More specifically, the invention relates to light sensitive epoxy formulations comprising an epoxy resin, a hardener and a halogenated organic compound as sensitizer.

PRIOR ART

In the manufacturing of microelectronic circuitry it is desirable to have a material which can double both as a photoresist material and as a dielectric material. The material must be chemically resistant, thermally stable, mechanically rugged and must have good adhesion properties. The material finds application in the manufacture of printed circuit boards where the material is required to provide a dielectric film between conducting surfaces. It may be used as a thermally stable mask for solder applications, a protective coating on circuit lines and elements, an etch or plating mask, thus, will be subjected to corrosive acids or basic solutions.

Wainer, U.S. Pats. 3,042,515, 3,042,518 and 3,046,125, disclose photoresists based upon the interaction of a vinyl compound, an arylamine and an organic halogen compound to provide stable print-out images by exposure to light.

Atkinson, U.S. Pat. 3,410,824, discloses a light sensitive resin which is prepared from an epoxy and a chalcone compound.

Erdmann, U.S. Pat. 3,295,974, discloses new light sensitive epoxy compositions which are prepared from epichlorohydrin and an unsaturated aromatic ketone.

SUMMARY OF THE INVENTION

In summary, the present invention comprises the steps of:

(a) Preparing a mixture of an epoxy resin and a hardener or curing agent;

(b) Aging the mixture until it substantially nears its gel point; and (c) Forming a film having from about 1% to about 5% by weight of the epoxy resin solids of a halogenated organic compound as a sensitizer.

The prepared light sensitive epoxy composition is coated onto a substrate and exposed to actinic radiation. The exposed film is heated to further harden the exposed areas. The unexposed areas are removed with a suitable solvent.

OBJECTS OF THE INVENTION

It is therefore an object of the present invention to provide photosensitive epoxy compositions.

In addition, it is another object of the invention to provide a method for rendering epoxy compositions light sensitive.

DETAILED DESCRIPTION OF THE INVENTION

For the purposes of this invention an epoxy resin is defined as a molecule containing more than one α-epoxy group (whether the group is situated internally, terminally, or on cyclic structures) capable of being converted to a useful thermoset form. Epoxy resins used in the present invention can be selected from among diglycidyl ether prepared from epichlorhydrin and bisphenol A (DGEBA), polyglycidyl ether of phenolformaldehyde novolac (epoxylated novolac), diglycidyl isophthalate, o-glycidyl phenyl glycidyl ether, triglycidyl ether of phloroglucinol, triglycidyl p-aminophenol, tetraglycidoxy tetraphenyl ethane, p-epoxy cyclopentenyl phenyl glycidyl ether and dicycloaliphatic diether diepoxy. The epoxy resin should have an epoxy equivalent weight of from about 150 to about 5,000 grams.

The conversion of an epoxy resin from a soluble thermoplastic state to an insoluble thermoset can be accomplished with a curing agent which becomes bound into and part of the resin chain. Curing agents of this type are called hardeners. If the agent promotes curing by catalytic action without being bound they are called activators or catalysts. A variety of compounds are known to function as hardeners. Among the classes of compounds useful for the purposes of this invention are as folows:

(a) amines—primary or secondary, aromatic or aliphatic, e.g., N,N′-diallylmelamine, diamino diphenyl sulfone, 4-4′-methylene dianiline, 2,6-diamino pyridine, diethylene triamine, triethylene tetramine, tetraethylene pentamine, pentaethylene hexamine, meta-phenylene diamine;

(b) cyclic anhydrides, e.g., tricarballylic anhydride, hexahydrophthalic anhydride, maleic anhydride adduct of methyl cyclopentadiene;

(c) amidopolyamines, e.g., the products prepared from carboxylic acids and polyamines where the carboxylic acid has a carbon chain of from 16 to 19 $CH_2$ group;

(d) imidazole, 2-ethyl-4-methyl imidazole;

(e) dicyandiamide.

The slow reaction between the epoxy and hardener is usually accomplished by dissolving the two in a mutual solvent. The amount of hardener added to the epoxy resin is based on the stoichiometry of the system. Said another way, the amount of hardener to be added will be based on the EEW of the epoxy resin. It will normally be added in amounts that would provide one active N (where amines are used) or one active H (where anhydrides are used) for every epoxy group in the epoxy resin as determined by its EEW. For the purposes of this invention there is added from about 75% to about 110% stoichiometric amounts of hardener to epoxy resin. Aging may be carried out at room temperature or at elevated temperatures so that the process does not exceed a convenient period usually a week. A halogenated solvent left in the film upon light exposure will by itself be of sufficient quantity to cause sensitization to ultraviolet light. Solvents which are satisfactory are: chloroform, methylene chloride, bromoform, and mixtures of these.

The amount of solvent used is determined by the amount of time of desired aging. For example if aging is to be for a short time relatively small amounts of solvent are used. Conversely, where longer periods of aging is desirable larger volumes of solvent can be used. In preferred embodiments of this invention, there is used, for every 100 grams of epoxy resin, 50 grams to 300 grams of solvent.

During the aging process reactions take place which cause the original epoxy molecule to increase in molecular weight from several hundred to several thousand with a corresponding increase in epoxy equivalent weight. Attainment of a useful level of light sensitization is associated with the relatively high molecular weight achieved during aging just short of reaching the gel point, i.e., the point reached during aging which results in the insolubilization of the resin. Although, as stated above, residual halogenated solvents remaining in the exposed film may be sufficient to act as a source of sensitizer, additional light sensitizers based on halogenated molecules may be added to further increase the sensitivity or extend the spectral range of sensitivity. This may be accomplished by adding usually no more than a total of 5% (based on resin solid weight in a coated film) of such halogenated materials as carbon tetrabromide, chloroform, carbon tetraiodide, bromoform, iodoform, carbon tetrachloride, hexachlorobenzene, n-bromosuccinimide, 1,2,3,4-bromobutane, tetrachlorotetrahydronaphthalene, to the aged material.

In order to extend the shelf-life of the aged material, i.e., to maintain the material near the gel point for a sufficiently convenient time span, it has been found that dilution with inert solvents and storage at near freezing temperatures are effective. In this way, dilution with an equal volume of solvent and storage at 0° C. have extended shelf-life from 5 days to 6 months. Once the material is coated on a substrate, however, it must be quickly processed, usually within 6 hours after the film has dried, otherwise the reactions which lead to gelation will cause gelation to occur before the material has performed its function. Refrigeration is also found to increase the useful life of the film deposited on a substrate.

The use of additives which are normally used in epoxy technology can generally be employed with the light sensitized systems. Obviously, additives which drastically interfere with either the light absorption of the system or with the photoreaction must be avoided. When additives are used it would be preferable to add them after aging of the material has been completed in order to avoid any possible deleterious interactions with the aging mechanism.

Substrates over which the aged-sensitized-epoxy solution is spread may be any metal, plastic, glass or any other material surface over which epoxy materials are normally spread.

Light exposure of the film in itself could over a relatively long period of time result in the occurrence of insolubilization. It has been found that a short light exposure followed by a short thermal exposure reduces the overall exposure period by a very significant amount. The range of light exposure time and intensity for a sufficiently aged material may be ascertained from the following typical conditions:

(a) one half mil thick film, 20 inches from a high pressure short arc mercury lamp manufactured by Osram G.m.b.H., Germany, Model HBO 500 watts, for a period of 2 minutes;

(b) one mil thick film, 15 inches from the same lamp as above for 4 minutes;

(c) a two mil thick film, 15 inches from the same lamp as above for 12 minutes.

The range of thermal exposure time and temperature is typically 5 to 20 minutes at temperatures from 70° C. to 90° C. for the films exposed to the above light conditions. Precise light and thermal exposure conditions will necessarily depend on the epoxy-hardener system, state of aging, amount and type of halogen-containing sensitizer, the transmission properties of the negative mask and the solvent power of development solvents.

Selection of a development solvent to remove the unexposed portions of the film is based upon rapid dissolution of the non-exposed portion with minimum effects on the exposed portion. With one mil thick films development times are on the order of one minute or less with mild agitation. Suitable solvents are, but not limited to, methylene chloride, methyl Cellosolve, methyl ethyl ketone, chloroform, and mixtures of these. Generally, a good solvent for the epoxy-hardener system which is being employed, will provide a suitable development medium.

The handling of the light sensitized epoxy materials must be performed in a yellow or red light to prevent unintentional exposure to wavelengths in the ultraviolet region. Although some of the formulations may upon exposure to ultraviolet produce a color change, this is considered incidental and not one of the objectives of this invention. When color changes have been observed, however, the intensity of the color can usually be associated with the degree of sensitivity of the film and hence could be used as sensitivity index under controlled conditions of thickness and exposure.

The following examples serve to illustrate specific practices of this invention and are not intended to limit the teachings as set forth herein.

Example 1

A hundred grams of a diglycidyl ether of bisphenol A having an epoxy equivalent weight of about 500 grams and a softening range of about 70° C. to about 80° C. was dissolved in 200 grams of chloroform containing 13.3 grams of methylene dianiline. The solution was aged for 14 days at room temperature. A one mil thick film, having about 3% by weight of resin solids in the film, of chloroform remaining therein was coated onto a substrate and exposed to a 500 watt mercury lamp in a predetermined pattern for 4 minutes. The exposed film was then heated at 70° C. for 10 minutes. Development of an image was accomplished by immersing the film in methylene chloride for 30 seconds with a 15 second clean rinse in methylene chloride. Resolution was in the range of ½ to 1 mil wide lines.

The ensuing examples in Table 1 below are given to illustrate the use of different hardeners. The epoxy used in these examples is the same as in Example 1. The table includes the hardeners used and their amounts, room temperature, aging time in days, and the times of exposure. The films had about the same amount of residual chloroform therein as in Example 1. They were exposed and developed as above.

TABLE 1

| Example | Hardener | Grams | Aging time (days) | Exposure time (per mil) min. |
|---|---|---|---|---|
| 2 | Triethylenetetramine | 6.0 | 3 | 8 |
| 3 | m-Phenylene diamine | 7.0 | 6 | 4 |
| 4 | 2,6-diaminopyridine | 7.0 | 12 | 8 |
| 5 | 2,4-toluene diamine | 7.5 | 6 | 4 |
| 6 | N,N'-diallylmelamine | 10.0 | 30 | 16 |
| 7 | 2-ethyl 4-methylamidazole | 54.0 | 10 | 16 |

The above compositions showed light sensitivity after aging for one day. However, the aging times given are deemed to be preferred.

The following examples given in Table 2 below are illustrative of the influence of epoxy equivalent weight (EEW) on the time and temperature of aging on the sensitivity of the material. In various experiments a hundred grams of diglycidyl ether of bisphenol A of different EEW were added to varying amounts of methylene dianiline in 200 grams of choloroform. Each of the solutions were aged at the temperature shown until they reached a preferred level of sensitivity. The sensitivity was determined periodically until exposure time was 4 minutes for one mil thick films prepared from each solution. The films were exposed to a 500 watt lamp at 15 inches. The exposed films were heated for 10 minutes at 70° C. and developed in methylene chloride for 30 seconds with a 15 second clean rinse. Table 2 illustrates the EEW and, amount of hardener, the temperature of aging and the time needed to attain a preferred level of sensitivity.

TABLE 2

| Example | EEW (grams) | Hardener (grams) | Temp. (° C.) | Time (days) |
|---|---|---|---|---|
| 8 | 170 | 26.0 | 25 | 7 |
| 9 | 510 | 13.3 | 25 | 14 |
| 10 | 635 | 7.0 | 25 | 17 |
| 11 | 925 | 4.3 | 25 | 21 |
| 12 | 925 | 4.3 | 35 | 14 |
| 13 | 925 | 4.3 | 50 | 6 |

Example 14

An epoxy composition comprising:

100 grams of polyglycidyl ether of phenol formaldehyde novolac having an EEW of 196–181 grams; 26 grams of methylene dianiline; 200 grams of chloroform, was aged for 4 days at a temperature of about 25° C. A coating of the compositions of about 1 mil was disposed onto a copper substrate. The coating contained about 5% of the chloroform solvent. After coating the film, it was exposed to U.V. radiation, in a predetermined pattern, for 8 minutes and heated at 80° C. for about 5 minutes. The film was then developed by immersion in choloroform for 30 seconds and a clean rinse in chloroform for 15 seconds. Etching of the copper film was accomplish with conventional etchants.

Example 15

An epoxy composition comprising 90 grams of diglycidyl ether of tetrabromo bis-phenol A, containing 21% Br and having an EEW of 455–500 grams, 10 grams of polyglycidyl ether of tetraphenylene ethane having an EEW of about 210–240 grams, 3.0 grams of dicyandiamide, 0.3 grams of N,N,N',N'-tetramethyl-1,3-butane diamine, 100 grams of methyl Cellosolve, was refluxed for 1.5 hours at 95° C. The composition was then aged for five days at room temperature. About five grams of carbon tetrabromide were added to the aged composition which was then coated onto a substrate. The coating was about 1 mil thick. Exposure in a predetermined pattern, under U.V. radiation was for about 10 minutes. The exposed film was heated and developed as in the above example.

What is claimed is:

1. A method of producing a visible image comprising the steps of:

(a) preparing an epoxy composition comprising an epoxy resin wherein said resin is a molecule containing more than one α-epoxy group capable of being converted to a useful thermoset form, a hardener wherein said hardener is a curing agent which becomes bound to and part of said resin and a halogenated hydrocarbon solvent in a concentration of 50 to 300 grams of each 100 grams of said epoxy resin;

(b) aging said epoxy composition until it substantially near its gel point to cause said composition to increase in molecular weight;

(c) exposing a film of said epoxy composition in a predetermined pattern to actinic radiation, said film containing from about 1% to about 5% by weight of resin solids of said halogenated hydrocarbon therein;

(d) heating the exposed film at a temperature of about 70° C. to about 90° C. for about 5 minutes to about 20 minutes to further harden the exposed areas in said pattern, and thereafter;

(e) solvent developing said exposed film to remove the unexposed portions of said film in said pattern to thereby provide an image.

2. A method according to claim 1 wherein said epoxy resin is selected from the group consisting of diglycidyl ether of bisphenol A, polyglycidyl ether of phenol formaldehyde novolac, diglycidyl isophthalate, o-glycidyl phenyl glycidyl ether, triglycidyl ether of phloroglucinol, triglycidyl p-aminophenol, tetraglycidoxy tetraphenyl ethane, p-epoxy cyclopentenyl phenyl glycidyl ether and dicycloaliphatic diether diepoxy, said epoxy resin having an epoxy equivalent weight between 150 and 5,000 grams.

3. A method according to claim 2 wherein said hardener is selected from the group consisting of diamino diphenyl sulfone, 4-4'-methylene dianiline, 2,6-diamino pyridine, 2 - ethyl-4-methyl-amidazole, N,N'-diallylmelamine, diethylene triamine, triethylene tetramine, tetraethylene pentamine, pentaethylene, hexamine, m-phenylene diamine, tricarballylic anhydride, hexahydrophthalic anhydride, maleic anhydride adduct of methyl cyclopentadiene, and the products prepared from carboxylic acids and polyamines where the carboxylic acid has a carbon chain of from 16 to 19 $CH_2$ groups.

4. A method according to claim 3 wherein said halogenated hydrocarbon is selected from the group consisting of chloroform, methylene chloride, carbon tetrachloride, carbon tetraiodide, iodoform, haxachlorobenzene, n-bromosuccinimide, 1,2,3,4-bromobutane, tetrachlorotetra hydronaphthalene.

5. A method according to claim 4 wherein said epoxy composition is aged from about 1 day to about 30 days.

6. A method according to claim 1 wherein said epoxy resin is a diglycidyl ether of bisphenol having an epoxy equivalent weight of about 500 grams and a softening range of about 70° C. to about 80° C., and is dissolved in 200 grams of chloroform.

7. A method according to claim 6 wherein said hardener is methylene dianilene.

8. A method according to claim 7 wherein said epoxy composition is aged for 14 days, and said film formed from said epoxy composition is exposed to actinic radiation for 4 minutes and is heated for 10 minutes at 70° C.

9. A method according to claim 6 wherein said hardener is triethylene tetramine and is present in the amount of 6.0 grams, said composition being aged for 3 days.

10. A method according to claim 6 wherein said hardener is m-phenylene diamine and is present in the amount of 7.0 grams, said composition being aged for 6 days.

11. A method according to claim 6 wherein said hardener is 2,6-diamino pyridine and is present in the amount of 7.0 grams, said composition being aged for 12 days.

12. A method according to claim 6 wherein said hardener is 2,4-toluene diamine and is present in the amount of 7.5 grams, said composition being aged for 6 days.

13. A method according to claim 6 wherein said hardener is N,N'-diallylmelamine and is present in the amount of 10.0 grams, said composition being aged for 30 days.

14. A method according to claim 6 wherein said hardener is 2-ethyl-4-methyl-amidazole and is present in the amount of 5.0 grams, said composition being aged for 10 days.

15. A method of producing a visible image which comprises:

(a) preparing an epoxy composition by dissolving 100 grams of polyglycidyl ether of phenol formaldehyde novolac having an EEW of about 176 to about 181 grams, and about 26 grams of methylene dianiline in 200 grams of chloroform, (b) aging said epoxy composition for 4 days at a temperature of about 25° C., (c) coating a film of said aged epoxy composition onto a substrate, (d) exposing said film to actinic radiation in a predetermined pattern for 8 minutes, (e) heating said exposed film at a temperature of about 80° C. for about 5 minutes, and (f) immersing the film in chloroform for about 30 seconds to thereby produce a visible image.

16. A method of producing a visible image which comprises:

(a) preparing an epoxy composition by mixing 90 grams of diglycidyl ether of tetrabromo bis-phenol A, containing 21% bromine and having an EEW of about 445 to about 500 grams, 10 grams of polyglycidyl ether of tetraphenylene ethane having an EEW of about 210 to about 240 grams, 3.0 grams of dicyandiamide, and 0.3 gram of N,N,N′,N′-tetramethyl-1,3-butane diamine in 100 grams of methyl Cellosolve, (b) refluxing said mixture for about 1.5 hours at a temperature of about 95° C., (c) aging said epoxy composition for 5 days at room temperature, (d) coating a film of said aged epoxy composition onto a substrate, (e) exposing said film to actinic radiation in a predetermined pattern for about 10 minutes, (f) heating said exposed film at a temperature of about 80° C. for about 5 minutes, and thereafter (g) immersing said film in chloroform for about 30 seconds to thereby produce a visible image.

References Cited

UNITED STATES PATENTS

| | | | |
|---|---|---|---|
| 3,410,824 | 11/1968 | Atkinson | 260—47 EP |
| 3,401,147 | 9/1968 | Smith, Jr., et al. | 260—47 EP |
| 3,295,974 | 1/1967 | Erdmann | 96—35 |

NORMAN G. TORCHIN, Primary Examiner

W. H. LOUIE, Jr., Assistant Examiner

U.S. Cl. X.R.

96—115 R, 35; 260—47 EP